United States Patent [19]
McKinnon

[11] Patent Number: 5,818,234
[45] Date of Patent: Oct. 6, 1998

[54] BATTERY TESTER WITH POWER LIMIT DETECTION

[75] Inventor: Donald C. McKinnon, Cheboygan, Mich.

[73] Assignee: Ferret Instruments, Inc., Cheboygan, Mich.

[21] Appl. No.: 646,931

[22] Filed: May 8, 1996

[51] Int. Cl.$^6$ .................................................. G01N 27/416
[52] U.S. Cl. .......................................... 324/433; 340/636
[58] Field of Search ...................................... 324/433, 435, 324/426, 142; 340/636, 455, 459, 461, 462, 661, 662, 664; 320/48

[56] References Cited

U.S. PATENT DOCUMENTS

| | | |
|---|---|---|
| 1,520,865 | 12/1924 | Heyer . |
| 3,848,181 | 11/1974 | Hebert, Jr. et al. ...................... 324/29.5 |
| 3,876,931 | 4/1975 | Godshalk ................................. 324/29.5 |
| 5,254,952 | 10/1993 | Salley et al. ............................ 324/429 |
| 5,426,371 | 6/1995 | Salley et al. ............................ 324/429 |
| 5,479,085 | 12/1995 | Honda ...................................... 324/425 |

*Primary Examiner*—Christine K. Oda
*Attorney, Agent, or Firm*—Gifford, Krass, Groh, Sprinkle, Patmore, Anderson & Citkowski

[57] ABSTRACT

In an electrical resistive-load battery testing system, apparatus and methods are disclosed for independently monitoring and reacting to both the temperature of the load and the power actually consumed by the load. The signals derived by the temperature and power monitoring aspects of the invention may be used to provide visual and/or audible indicators to alert an operator that the system has exceeded predetermined operating levels. The load may be of a carbon-pile construction, though other loading arrangements are possible. According to the direct load-power monitoring aspect of the invention, electrical circuity is used to generate a signal representative of the power consumed by the load as a function of the voltage applied across the load and the current through by the load during the test, and a function such as an operator alert is performed in response to the power consumed by the load.

9 Claims, 4 Drawing Sheets

BATTERY TESTER WITH POWER LIMIT DETECTION

FIELD OF THE INVENTION

The present invention relates generally to battery testers of the type which employ a variable impedance load and, more particularly, to such a tester including means for sensing load temperature and/or means for performing a measurement of the actual power consumed by the load.

BACKGROUND OF THE INVENTION

A standard test performed on batteries such as those used in automotive and other vehicular applications involves monitoring output voltage under a predetermined load condition. Such loading is popularly carried out with a variable resistance element such as a carbon pile, which is typically placed directly across the battery during such a measurement. The impedance of the carbon pile is typically varied by changing the pressure across the carbon disks which make up the pile, usually through a manually operated threaded shaft. Squeezing the carbon disk stack reduces the resistance, thereby increasing the load current through the stack. This approach has been taken for many years, as evidenced by U.S. Pat. No. 1,520,865 entitled "Apparatus and Meter for Testing Batteries," which discloses a manually pressurized carbon pile loading apparatus.

Although carbon-pile loads represent a convenient testing arrangement with high power-handling capabilities, the temperature within the carbon pile rises quickly as heavy currents pass through the load. Without proper controls, if the carbon pile exceeds its maximum power rating, or if temperature is exceeded, damage to the tester and/or carbon pile itself may occur due to oxidation or other failure mechanisms.

Existing sensing techniques only monitor carbon-pile conditions indirectly and provide no indication of excessive power consumption or when the rated temperature is exceeded. Other tester loads are known which incorporate heat sensors, but these do not actually sense the temperature of the resistance element itself. One known technique, for example, uses a sensor clamped to a metal bracket to sense the temperature proximate to the load. Another approach senses the temperature of the load cables near the load. Both of these techniques suffer from a delay problem and, since they do not actually measure carbon temperature directly, the user tends to be overly conservative during operation, thus missing out on the instrument's entire useful range. In terms of power consumption, existing techniques either sense current, or voltage, but not the effect of both, again, leading to an ineffective solution and overly conservative operation.

The need remains, therefore, for a battery tester apparatus incorporating affordable, yet effective, means for ensuring that the resistive load used by such an instrument is not damaged due to inadvertent excessive temperature, or does not consume excessive power. Ideally, indicators associated both with a temperature limit and a power limit would be provided.

SUMMARY OF THE INVENTION

The present invention improves upon existing battery testing apparatus utilizing a resistive load by providing apparatus and methods for independently monitoring and reacting to both the temperature of the load and the power actually consumed by the load. The signals derived by the temperature and power monitoring aspects of the invention may be used for any useful purpose including, in a preferred embodiment, visual and/or audible indicators to alert an operator that the apparatus has exceed temperature and/or power limit levels. In disclosed examples, the load is of a carbon-pile construction, though other loading arrangements are possible.

In addition to means for coupling a battery to the load to perform a test thereon, a battery load-temperature monitoring system according to the invention also includes an optical sensor supported to receive thermal radiation from the load, and output an electrical signal representative of the level of radiation emitted by the load. Means connected to receive the electrical signal from the optical sensor are further provided to perform an operational function if the level of radiation emitted by the load exceeds a predetermined value. Such an operational function might include, for example, a visual or audible alert. In a preferred embodiment, an optically directional silicon phototransistor is employed as the radiation sensor in conjunction with daylight filtering and heat shielding, though various other passive/active sensing arrangements are possible.

The direct load-power monitoring aspect of the invention system includes means for sensing both the voltage developed across the load during the test and the current through the load during the test. Electrical circuity is then used to generate a signal representative of the power consumed by the load as a function of the voltage developed across the load and the current through the load during the test, and a function such as an operator alert is performed in response to the signal representative of the power consumed by the load.

The electrical circuitry used to generate a signal representative of the power consumed by the load may take on a variety of forms, and may be implemented using analog and/or digital circuit techniques. In one embodiment, power is sensed or computed along a continuous power curve associated with the power-level rating for the load. In a preferred, alternative embodiment, however, such electrical circuitry operates on the basis of one or more power-related segments so as to approximate a portion of the continuous power curve associated with the power-level rating of the load. In one example, one or more summing amplifiers are each used to simulate substantially linear load lines, each approximating a different portion of the continuous power curve, each amplifier sensing the product of the voltage and current being applied to the load by the battery. More particularly, each such summing amplifier may further comprise a first resistor connected to one of the terminals, the value of the first resistor being chosen to sense a nominal voltage within a predetermined range, and a second resistor connected to the other of the terminals to sense current. In the case of multiple nominal voltages, the outputs of a plurality of summing amplifiers are logically combined to establish a set of overlapping, cooperating load lines.

A method of monitoring power consumed by a load in a battery testing system would therefore include the steps of:
a) connecting a battery across the load to perform a test;
b) sensing the voltage across the load during the test;
c) sensing the current through the load during the test;
d) determining the power consumed by the load as the product of the voltage across the load and the current through the load;
e) providing a monitoring signal as a function of the determined power level.

DETAILED DESCRIPTION OF THE PREFERRED EMBODIMENT

Figure 1:
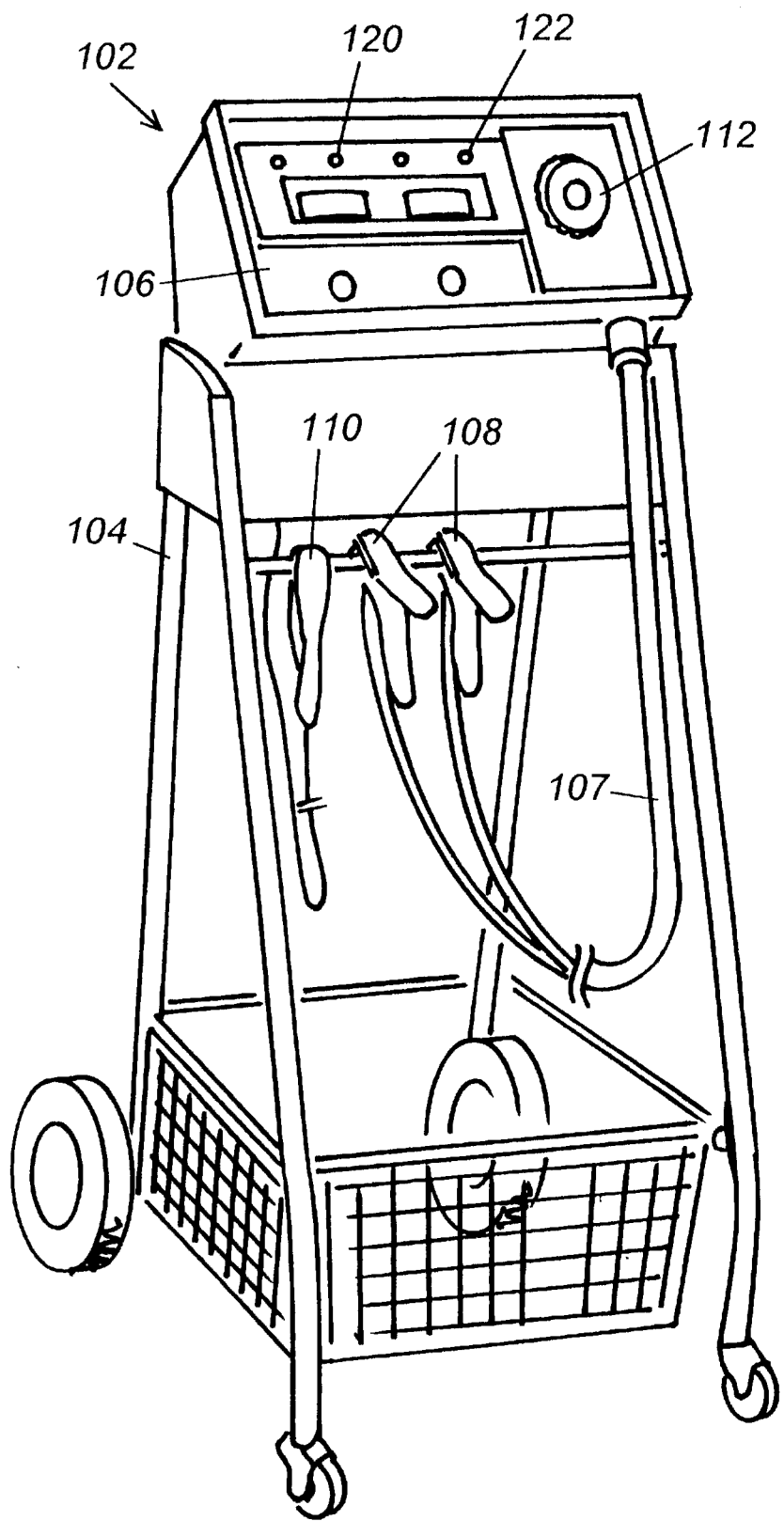
FIG. 1 illustrates a battery load tester for vehicular applications which incorporates the inventive principles disclosed herein.

FIG. 1 is a drawing which illustrates, from an oblique perspective, an automotive-type battery load tester which incorporates inventive principles disclosed herein. The tester instrument itself, depicted generally at 102, may be conveniently supported on a detachable, rolling stand 104 to enhance mobility. A front panel 106 on the instrument contains a number of controls and indicators, and, also from this panel there extends a cable 107 terminating in a set of battery clamps 108 and optional inductive current probe 110.

The battery clamps 108 make electrical connection to a carbon-pile type resistive load (not visible in the drawing), with pressure upon the stack of carbon disks being controlled by a knob 112 on the front panel 106. The carbon pile is also preferably fan cooled. The electrical connections to the load and to other circuit components will be better understood with reference to FIGS. 2 and 4, which provide schematic diagrams for the unit. The control knob 112 sets load current to a determined test amperage. In a preferred construction, a single turn of the knob 106 varies current through a comprehensive useful range, with a spring detent being used for tactile feedback of the OFF position. In a typical application, the pile can load a 12-volt battery at a current of up to 600 amps, and 24 volt alternators at a current of up to 150 amps. Other voltage and current ratings may be readily accommodated through engineering design change.

Located on the front panel 106 of the instrument 102 are two indicator lamps, 120 and 122, respectively. The indicator lamp 120, which is labeled LOAD LIMIT, provides a visual indication of when the actual power consumed by the carbon pile has exceeded a predetermined value. Both lamps, including lamp 122, labeled LOAD HOT, indicate (in conjunction with an audible alarm), when the temperature of the carbon pile has exceeded a predetermined level. Activation of these indicators 120 and 122 will be better understood from the discussion of the electrical aspects of the system, but it should be kept in mind that, given the availability of the indicator signals derived according to the invention, such signals may alternatively be used for a variety of other purposes. That is, although, in the embodiments described herein, the power and temperature limit signals are used to activate a visual or audible indicator, it will be appreciated by one of skill in the electrical field that such signals may also be used as feedback signals to control voltage, current, power or temperature or, alternatively, may be used to drive or supply information to an external device associated with data recording or other types of tests.

LOAD LIMIT CIRCUITRY AND OPERATION

Figure 2:
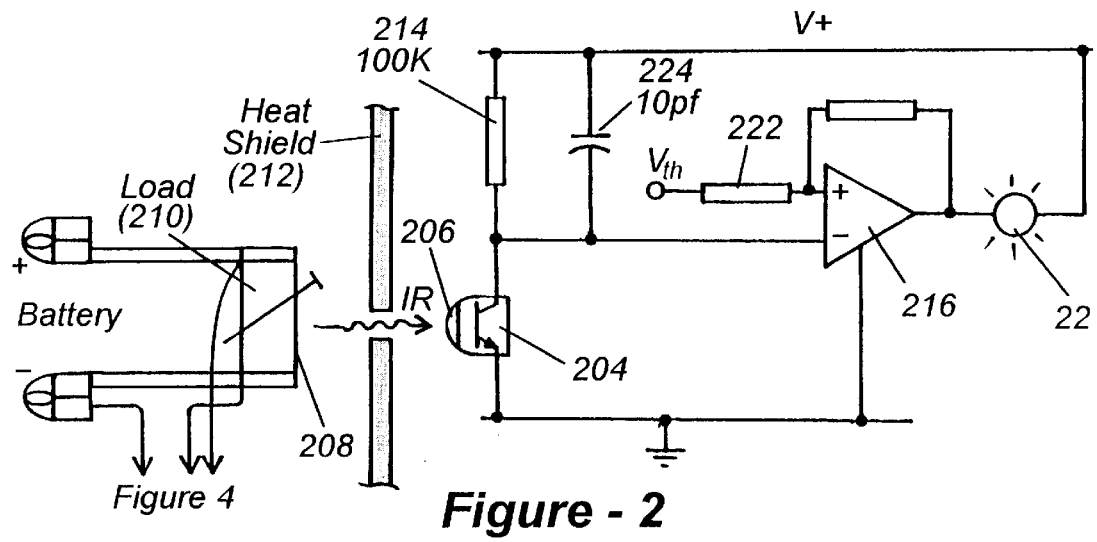
FIG. 2 is an electrical schematic diagram used to indicate major components associated with a temperature limit indicator according to the present invention.

The discussion will now focus on the electrical aspects of the over-temperature circuitry and operation, followed by a detailed discussion of the power-level sensor and indicator. FIG. 2 is an electrical diagram used to indicate major components associated with the temperature limit indicator aspect of the invention. Broadly, the temperature of the carbon-pile load is detected by an electronic infrared sensor aimed at an exposed surface of the carbon pile. Although other types of devices may be employed, a low-cost silicon phototransistor 204 is preferably used as the sensor. More specifically, an IR sensor such as model OP598B from the Optek Company is used, which is made optically directional through the use of an internal lens 206. The detector element is aimed at a hot load surface 208 of the carbon-pile load 210, at a distance of approximately two to three centimeters. A heat shield 212 is used to block radiation beyond the sensed field of use so as to protect the detector and other electrical components from excessive heat.

Continuing the reference to the schematic of FIG. 2, a resistor 214 is used to develop a voltage based upon the photocurrent generated by the sensor 204. This voltage is fed to the inverting side of a comparator 216 which, in turn, drives an indicator lamp 220 when an adjustable threshold voltage is exceeded. This threshold voltage 222, which is fed into the non-inverting side of the comparator 216, represents a value previously determined to match the amount of radiation received as a function of maximum temperature. Sensing hysteresis is provided by positive feedback to produce a definite indication as well as different levels for "hot" and "cool" temperatures. A capacitor 224 is used to average momentary radiation variations that may come from carbon-pile sparking or other light flashes, thus minimizing or, preferably, preventing false indications.

In one example, a target maximum temperature of 500° C. was used, since, beyond this point, damage to the carbon-pile plates may occur through oxidation. Of course, the threshold voltage and other component values may be altered for different target temperatures. Thus, the various components shown in FIG. 2, and in particular, the threshold voltage 222, has been chosen in this implementation to correspond and calibrate to a maximum of 500° C. Provision has also been made to shield the photodetector 204 from sunlight and incandescent lighting, which are also sources of infrared radiation. Although 900 nm is not in the visible spectrum, it is still sensitive to the solar emissions band so that sunlight should be shielded out. If the detector used is only sensitive to wavelengths longer than 1500 nm, however, sunlight would be less of a potential problem since it has a lower energy content in that portion of the spectrum. Therefore, in the preferred embodiment, a daylight blocking filter is used to reduce the sensitivity to shorter wavelengths in the visible spectrum. Although other detectors may be used in accordance with this invention, including other types of photosensitive two- and/or three-terminal devices, thermopiles and electrically balanced thermal detectors, detectors of wavelengths beyond 900 nm are, at present, more expensive and generally disfavored for economic reasons.

The relationship of radiation intensity to temperature (T) and wavelength ($\lambda$) may be expressed by Planck's Law, which relates detector current flow to temperature and wavelength as follows:

$$J = (C1)(\lambda)^{-5}/[\exp(C2/\lambda T) - 1]$$

Figure 3:
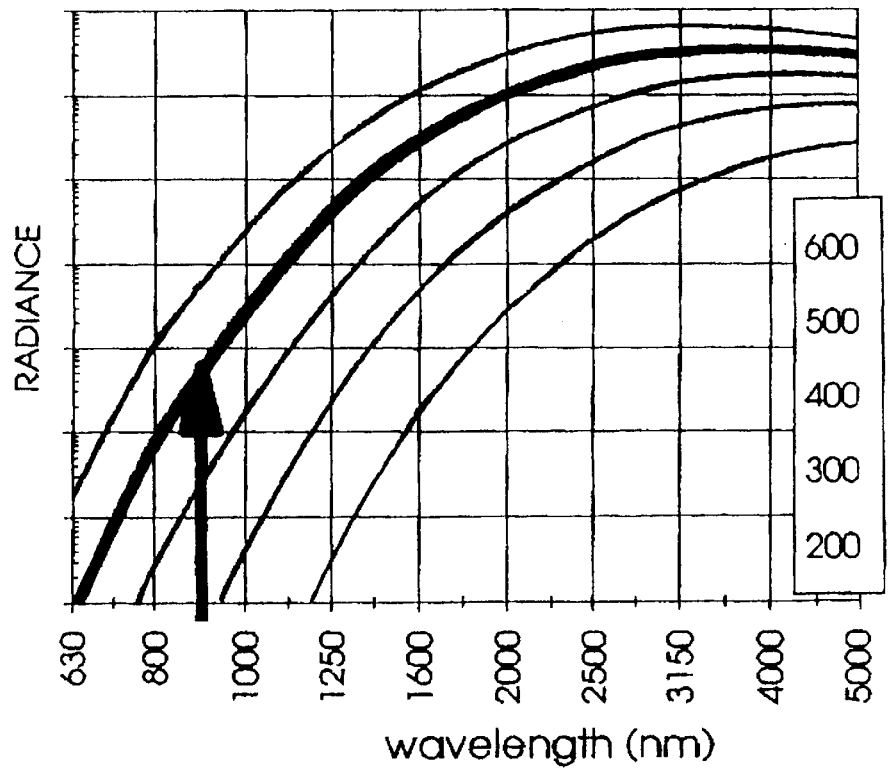
FIG. 3 illustrates a known relationship between spectral radiation emitted as a function of wavelength for family of temperature curves.

According to this expression, a 500° C. black body radiator will double the amount of its radiative energy output at 900 nm with just a 25° C. change in temperature. Accordingly, it is quite straightforward to set a detector threshold voltage 222 for a temperature which is sufficiently specific for thermal protection in this particular application. The graph in FIG. 3 illustrates the known relationship between the amount of spectral radiance as a function of wavelength for different temperatures. The dashed line within the family of curves represents the target maximum temperature of 773° K., which corresponds to 500° C. At this temperature, a threshold is used to indicate detection at 0.1 watts/meter², a value which is readily detectable with a low-cost silicon phototransistor of the type described above.

DIRECT POWER SENSING CIRCUITRY AND OPERATION

Carbon-pile loads are typically less limited in their range of operating current and voltage than in their power handling capability. Staying within the acceptable rating of a load is ordinarily dependent upon the user, who should observe the published rating for that load, if one exists. However, when a rating is not available, or if it is complicated by being dependent on both current and temperature, the user is not likely to know when a particular application is approaching a damaging level. Thus, users often either use such equipment in an overly cautious manner, thereby limiting its useful range or, alternatively, may unknowingly overstress the load, resulting in premature failure.

The acceptable power level associated with a carbon-pile load is dependent upon its geometry and material composition. If the load heats too rapidly, it can develop damaging hot spots. A more limited power rate allows the heat generated sufficient time to diffuse throughout the plates that make up the pile which, in turn, helps to minimize hot spots. In practice, application of the load of a carbon-pile load is typically rated by load amperes to be drawn, however, if the load is also rated for different battery voltages, a simple current level detector scheme is not sufficient to indicate the true limit of the actual power consumed.

The power input to a load is the arithmetic product of its applied voltage and current, i.e., power=V×A. Making reference FIG. 4, various circuit configurations are possible to generate a signal which is proportional to the volts/amps product. In terms of analog circuits, the possibilities include logsum-antilog, variable resistance dividers using logarithmic diode bias control, switched duty control, Hall-effect multipliers, and other techniques. Digital implementations may use programmed computers, input-addressed ROM tables, and various other implementations. Thus, in FIG. 4, a generic "black box" 402 is shown to broadly indicate a V×A function utilizing any appropriate analog or digital circuit technique. Regardless of the approach taken, the inputs to the box 402 include lines 404 and 406, which make connection to opposing sides of the load 410 to sense voltage. Amperage is usually sensed using a resistance in series with the load, though other methods may be used such as magnetic-field detection. In this example, the cable connected to the instrument reference voltage was conveniently used, since it has a known resistance. Sense connections 405 at the load end and 407 at the clamp end of the battery cable are used as inputs along lines 406 and 408, respectively in this example to sense the current through one of the battery cables, assuming a given level of line resistance or voltage drop such as three millivolts per ampere of current drawn. In practice, either end of the cable can be used as a reference point, but there are implementation considerations for what voltage is included in that attributable to the load. In this case the point of reference is the clamp end of the cable, so that voltage to one of the two cables is counted as part of the load voltage. This contribution could be separated out, but the effectiveness of the indicator would not be appreciably improved.

Figure 4:
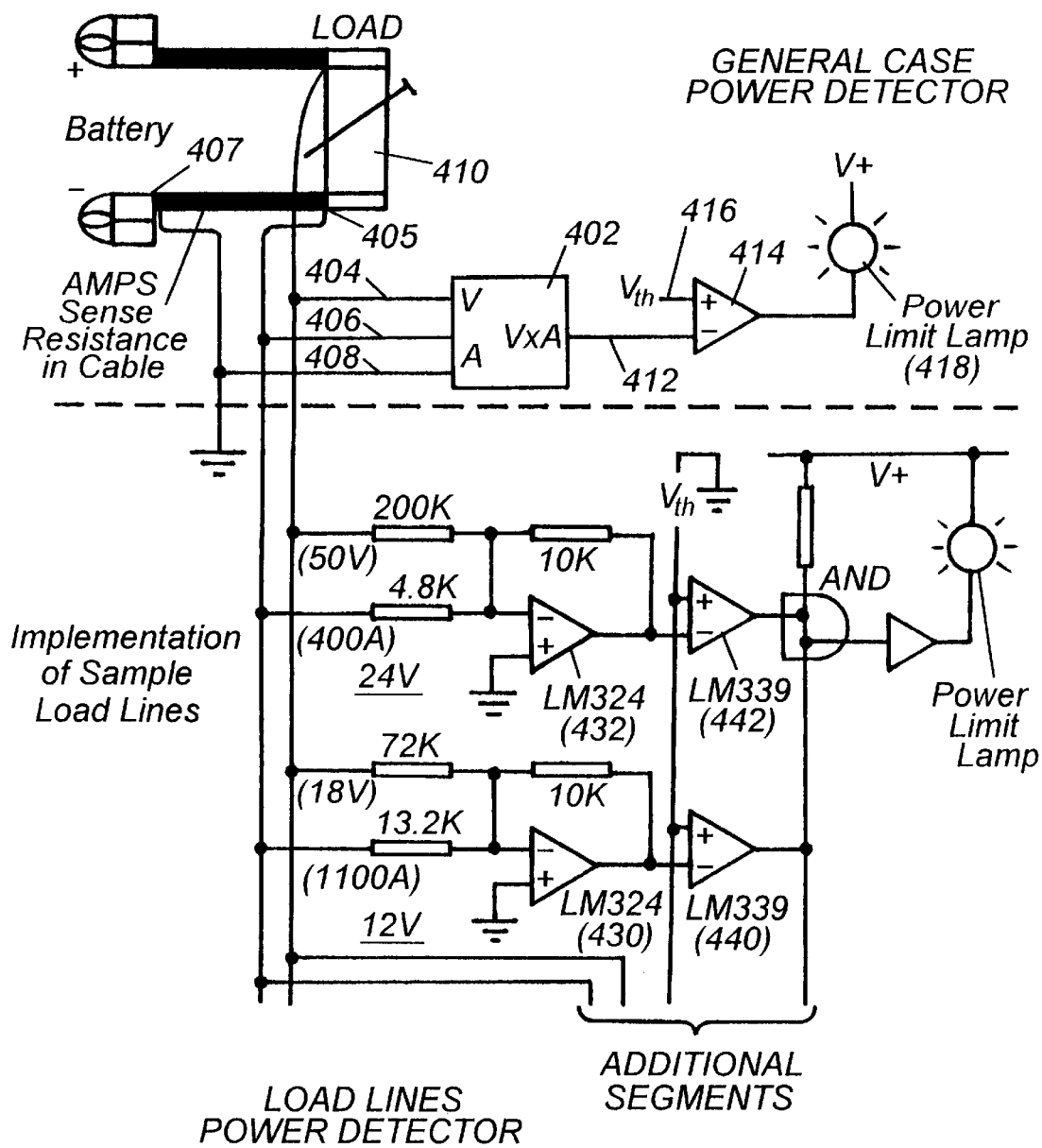
FIG. 4 is an electrical schematic diagram used to illustrate major components associated with direct load power sensing according to the present invention.

Given these inputs to the "black box" of 402 in FIG. 4, a power product signal is available along line 412, which feeds one side of a comparator 414, the other side receiving a threshold voltage 416. In the event that the voltage on level 412 represents a power limit in excess of a predetermined value, the comparator 414 will generate an output signal along line 418, to provide a useful operator-oriented function, such as the activation of a visual indicator 420, or other type of alarm or function.

Figure 5:
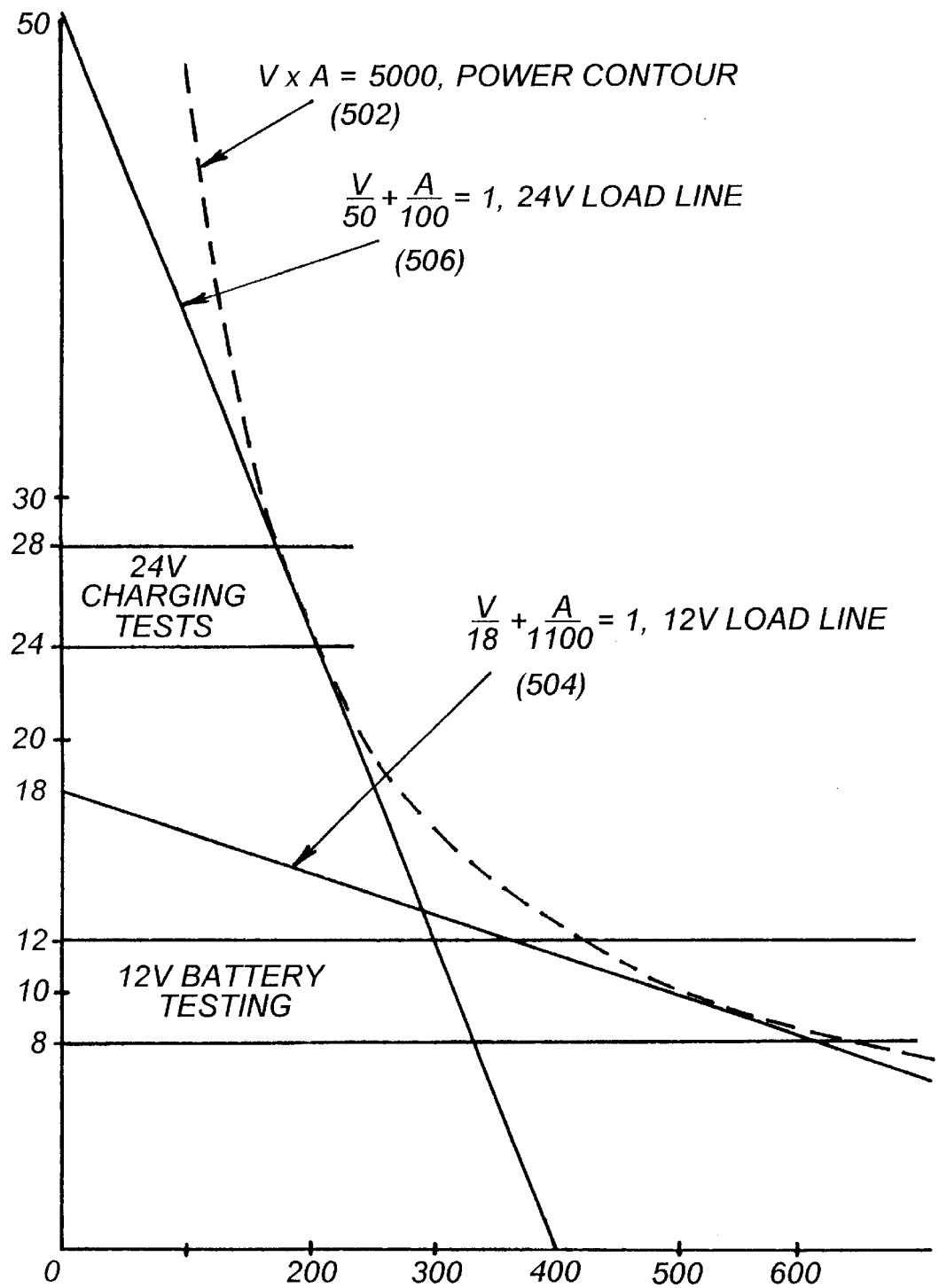
FIG. 5 is a volt/amp graph illustrating power curves and the way in which straight load lines may be used to approximate a boundary of equal power according to the invention in conjunction with the rating of an instrument incorporating inventive principles.

Utilizing the approach just described, the invention monitors actual power consumed by the load more or less along a continuous power contour as shown with broken line 502 in FIG. 5. That is, whether analog or digital techniques are utilized, the product of volts times current is monitored at a range of operational conditions, and across a relatively large range of voltages and currents with fine granularity. In an alternative embodiment of the invention, load power may be sensed through the use of one or more overlapping volt-amp load lines to approximate a boundary of equal power for the rating of the instrument. Such a load line is created by the sum of the load voltage (V) and a voltage proportional to the load amperes (A). Thus, according to this aspect of the invention, when $X_1V+Y_1A>P$, the over-power-limit indicator will be activated. In this expression, the values of X and Y are proportionating coefficients, and P is the power threshold.

The load lines 504 and 506 may be coincident and generally approximate with the true power limit curve 502 in FIG. 5 within a useful span. Moreover, beyond each span, the line will lie across points of lower power, thereby providing an inherent margin of safety. If more than one load line is employed, an approximation to the desired power curve can be extended over a greater span. Logically, this may be expressed as:

$[x_1V+y_1A]$ AND $[\ldots]$ AND $[x_nV+Y_nA]>P$, then indicate.

For example, if the load of the application is rated to be for 12 and 24 volt electrical systems, the load power boundaries can be approximated by the two load lines 504 and 506 shown in FIG. 5. Electrically, the load lines may be implemented using two summing amplifiers 430 and 432 in FIG. 4, respectively, with level comparators 440 and 442, which operate the indicator when both amplifier outputs exceed chosen limits. This method is simple to implement using low-cost parts yet produces repeatable and stable results with minor calibration requirements. Portions of the load lines outside of the normal operating levels which cause "over power" indications are compatible with the testing circumstances on vehicle battery systems.

In FIG. 5, the two load lines are derived from the expressions V/18+A/1100=1, and V/50+A/400=1, and correspond to the 12- and 24-volt situations, respectively. The operating range for testing a 24-volt charging system is preferably within 24 to 28 volts, whereas the range for testing 12 volt batteries is within 12 to 8 volts. Both of these ranges are delineated in the figure. Note that the load lines are preferably positioned so as to coincide with the targeted power curve within these ranges. However, due to other load considerations, it may be desirable to target for different power levels at different operating points. Thus, the segmented nature of this method makes it possible to approximate a non-uniform curve. Although two load lines are used in this embodiment, there can be as many as desired to fill in the boundaries of the load, as implied by the "additional segments" block 450 in FIG. 4. The specific numerical values are given in FIG. 5 for purposes of illustration only, and will vary in accordance with the actual implementation.

In summary, the present invention provides means for sensing load temperature in a battery testing apparatus, as well as providing generic and specific apparatus and methods for monitoring actual power consumed by such a load. In one embodiment of a power-sensing approach according to the invention, analog and/or digital techniques are utilized to determine an actual power contour, beyond which an action is taken, typically involving an operator warning of some kind. In an alternative embodiment, circuitry is disclosed to approximate a continuous power curve with one or more segments, preferably in the form of straight load lines associated with predetermined or particular operating voltages, currents, or both. It should be pointed out that, although specific circuits have been used as examples to generate straight load-line approximations, any other form of segmentation used to approximate a power curve in a battery testing situation should be considered as within keeping with this invention, including both linear and non-linear curve-fitting techniques.

What is claimed is:

1. In a battery testing system wherein a battery is placed across a load having a power level rating to perform a test on the battery, the system including means for sensing the voltage developed across and means for sensing the current through the load during the test, the improvement comprising:

electrical circuitry operative to generate a signal representative of the power consumed by the load as a function of the voltage and current during the test; and an indicator that signals to the system operator when the power consumed by the load exceeds the rating.

2. The battery testing system of claim 1, wherein the electrical circuity to generate a signal representating the power consumed by the load uses analog circuit techniques.

3. The battery testing system of claim 1, wherein the electrical circuity to generate a signal representing the power consumed by the load uses digital circuit techniques.

4. In a battery testing system wherein a battery is placed across a load to perform a test on the battery, a load power monitoring system, comprising:

a load having a power level rating;

means for coupling the battery to the load to perform a test on the battery;

means for sensing the voltage developed across the load during the test;

means for sensing the current through the load during the test;

electrical circuitry to generate a signal representative of the power consumed by the load as a function of the voltage developed across the load and the current through the load during the test, the circuitry utilizing one or more segments that approximate a portion of a curve associated with the operating power-level of the load; and an operator indicator responsive to the signal representative of the power consumed by the load.

5. The battery testing system of claim 1, including one or more substantially linear load lines, each approximating a different portion of the curve associated with the power-level rating of the load.

6. The battery testing system of claim 5, wherein each load line is generated using one or more summing amplifiers in electrical communication with the load, each amplifier sensing the sum of the voltage and current being applied to the load by the battery.

7. The battery testing system of claim 6, wherein the load has two terminals to which the battery is coupled, and wherein each summing amplifier further comprises:

a first resistor connected to one of the terminals, the value of the first resistor being chosen to sense a nominal voltage within a predetermined range; and a second resistor connected to the other of the terminals to sense current from the shunt voltage of the attached cable.

8. The battery testing system of claim 7, including a plurality of summing amplifiers cooperating to establish a set of overlapping load lines to approximate a boundary of power associated with the power level rating.

9. A method of monitoring power consumed by a load in a battery testing system, comprising the steps of:

connecting a battery across the load to perform a test;

sensing the voltage across the load during the test;

sensing the current through the load during the test;

determining the continuous power consumed by the load as the product of the voltage across the load and the current through the load;

providing a monitoring signal as a function of the determined power level.

* * * * *